(12) United States Patent
Sakoh

(10) Patent No.: US 6,172,389 B1
(45) Date of Patent: Jan. 9, 2001

(54) SEMICONDUCTOR MEMORY DEVICE HAVING A REDUCED AREA FOR A RESISTOR ELEMENT

(75) Inventor: Takashi Sakoh, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/283,539

(22) Filed: Apr. 1, 1999

(30) Foreign Application Priority Data

Apr. 1, 1998 (JP) .................................................. 10-088799

(51) Int. Cl.$^7$ .................................................. H01L 27/108
(52) U.S. Cl. .......................... 257/296; 257/379; 257/380; 257/536
(58) Field of Search .................................... 257/296, 358, 257/359, 360, 363, 379, 380, 536, 538, 540

(56) References Cited

U.S. PATENT DOCUMENTS

| | | | |
|---|---|---|---|
| 4,419,812 | * 12/1983 | Topich | 29/571 |
| 4,786,612 | * 11/1988 | Yau et al. | 437/47 |
| 5,281,555 | * 1/1994 | Cho | 437/195 |
| 5,736,421 | * 4/1998 | Shimomura et al. | 437/52 |
| 5,834,815 | * 11/1998 | Cheng et al. | 257/379 |
| 5,852,311 | * 12/1998 | Kwon et al. | 257/315 |
| 6,023,099 | * 2/2000 | Komuro | 257/758 |

FOREIGN PATENT DOCUMENTS

| 7-235616 | 9/1995 | (JP) . |
|---|---|---|
| 8-274274 | 10/1996 | (JP) . |

* cited by examiner

Primary Examiner—Olik Chaudhuri
Assistant Examiner—Ginette Peralta
(74) Attorney, Agent, or Firm—Scully, Scott, Murphy & Presser

(57) ABSTRACT

A DRAM has a plurality of memory cells each including memory cell transistor and a peripheral circuit having a resistor element. The resistor element formed from a common layer with a contact plug in contact with the diffused regions of the cell transistor is disposed on a dummy pattern formed from common layer with the gate electrode of the cell transistor. The equal level for the resistor element and the contact plug provides an excellent fine patterning, thereby reducing the chip size of the DRAM.

7 Claims, 10 Drawing Sheets

SEMICONDUCTOR MEMORY DEVICE HAVING A REDUCED AREA FOR A RESISTOR ELEMENT

BACKGROUND OF THE INVENTION (a) Field of the Invention

The present invention relates to a semiconductor memory device having a reduced area for a resistor element in a memory cell.

(b) Description of the Related Art

A dynamic random-access memory (DRAM) is a typical semiconductor memory device, which includes a memory cell area receiving therein a plurality memory cells arranged in a matrix, and a peripheral area receiving therein a control circuit for controlling the read/write operation for the memory cells and a power supply circuit having a plurality of resistor elements.

Referring to FIG. 1 showing a conventional DRAM, each memory cell in the memory cell array includes a cell transistor having source/drain regions 13 disposed in a surface region of a silicon substrate 11 separated by a LOCOS field oxide film 12, and a 200-nm-thick gate electrode 15 disposed above the silicon substrate 11 with an intervention of a 8-nm-thick gate oxide film not shown in the figure. In this text, all the dimensions used herein are approximate values if not specifically recited.

The gate electrode 15 has a laminate structure including a 100-nm-thick polycrystalline silicon (polysilicon) and a 100-nm-thick tungsten silicide film. In the case of 256 Mbit DRAM, the gate width is 0.22 μm and the space between the gate electrodes 15 is 0.28 μm.

The source/drain regions 13 are electrically connected to respective overlying electrodes via first and second contacts 19 and 20. These contacts 19 and 20 are implemented by a phosphorous-doped polysilicon film, which is electrically insulated from the gate electrodes 15 by a 100-nm-thick cap oxide film 17 overlying the gate electrodes 15 and a 60-nm-thick side wall oxide filmS 18 disposed at the side walls of the gate electrodes 15.

In the case of 256 Mbit DRAM, the widths of the contacts 19 and 20 are 0.28 μm and the space between the contacts 19 and 20 are 0.22 μm, as viewed in a section passing perpendicularly to the gate electrodes 15.

The first contact 19 is electrically connected to a bit line 23 via a polysilicon plug 22, whereas the second contact 20 is electrically connected to a capacitor electrode 25 implemented by a 800-nm-thick phosphorous-doped polysilicon film. A capacitor dielectric film (not shown) and a 150-nm-thick cell plate electrode 26 made of phosphorous-doped polysilicon are consecutively formed on the capacitor electrode 25, and a third level interlayer dielectric film 27 is formed covering the entire surface including the cell plate electrode 26. The capacitor dielectric film is implemented by a 7-nm-thick silicon nitride film.

On the other hand, a power supply section including a plurality resistor elements is provided on the peripheral region of the memory device. In the power supply section, a first level interlayer dielectric film 32 and a second level interlayer dielectric film 33 are consecutively formed on the LOCOS field oxide film 12, and the resistor element 21 implemented by a 100-nm-thick phosphorous-doped polysilicon film is formed on the second level interlayer dielectric film 33.

The cell plate electrode 26 and the resistor element 21 are formed from a common polysilicon film formed in a lithographic step. In the case of 256 Mbit DRAM, the resistor element 21 has a line width of 0.8 μm and a line space of 0.8 μm. The resistor element 21 has a pair of lead elements 28 at which the resistor element 21 is electrically connected to overlying interconnects via contacts 29.

FIGS. 2A to 2E consecutively show a fabrication process for the DRAM of FIG. 1. In FIG. 2A, a gate oxide film not shown in the figure is formed to a thickness of 8 nm after forming a field oxide film 12 on a silicon substrate 11, followed by formation of gate structures each including a gate electrode 15 and a cap oxide film 17 and source/drain diffused regions 13 in combination with the gate structures. Each gate structure includes 100-nm-thick silicon oxide film/100-nm-thick tungsten silicide film/100-nm-thick polysilicon film, for example, as viewed from the top.

Thereafter, as shown in FIG. 2B, a 60-nm-thick oxide film 35 is grown over the entire surface, followed by etch-back thereof in the memory cell area. Subsequently, a 150-nm-thick phosphorous-doped polysilicon film is formed, followed by patterning thereof to leave contacts 19 and 20 at specified locations in the memory cell area. Further, as shown in FIG. 2C, a first level interlayer dielectric film 32 is formed over the entire surface, followed by a photolithographic etching thereof to form via holes for exposing the first contact 19, and subsequent deposition of polysilicon to form bit lines 23 and a contact plug in contact with the contact 19.

Thereafter, as shown in FIG. 2D, a second level interlayer dielectric film 33 is formed over the entire surface, followed by photolithographic etching thereof to form a via hole exposing the second contact 20, deposition of a 800-nm-thick phosphorous-doped polysilicon film, and patterning thereof to form a capacitor electrode 25 in contact with the second contact 20.

Subsequently, as shown in FIG. 2E, a 8-nm-thick silicon nitride film implementing a capacitor dielectric film and a 150-nm-thick phosphorous doped polysilicon film are consecutively deposited, followed by patterning thereof by a photolithographic etching step to form a cell plate electrode 26 in the memory cell area and a resistor element 21 in the peripheral area in the common process.

After a third level interlayer dielectric film 27 is formed over the entire surface, via holes are formed for connecting the cell plate electrode 26 and the resistor element 21 with overlying electrodes, thereby obtaining the structure shown in FIG. 1.

In the conventional DRAM as described above, there is a problem in that the cell plate electrode 26 and the resistor element 21, implemented by a common level interconnect layer, causes a larger occupied area for the resistor element 21, which hinders the DRAM from being formed in a smaller design rule.

Specifically, the polysilicon film for implementing the cell plate electrode 26 is generally doped with phosphorous at as high as $1.0 \times 10^{20}$ atoms/cm$^3$ so as to suppress generation of depletion layer in the capacitor element. In this case, the sheet resistance of the polysilicon film is as low as 50 Ω/Δ. Even in this low sheet resistance of the polysilicon film, the portion of the polysilicon film implementing the resistor element 21 must have a resistance as high as 1000 kΩ, for example. This high resistance may be obtained by the portion of the polysilicon film having a width of 0.8 μm and a length as large as 16 mm. The large length for the resistor element 21, however, requires a large occupied area, as shown in FIG. 3, wherein the resistor element 21 together with an associated pair of lead elements 28 is shown in a top plan view.

In order to reduce the occupied area for the resistor element 21, the resistor element 21 should have a smaller width for increasing the resistance of the resistor element 21 obtained from the polysilicon film. However, the smaller width requires an accurate patterning of the polysilicon film, which necessitates an increase of the cost for the DRAM because of a specific exposure step for a fine patterning.

In addition, in the DRAM as described above, the capacitor insulation layer is implemented by a silicon nitride film, which has a smaller dielectric constant and thus provides only a small capacity per unit area for the capacitor element. If the silicon nitride film is replaced by a ferroelectric material having a high dielectric constant, such as a tantalum oxide film, for obtaining a larger capacity per unit area for the capacitor element, the material for the cell electrode should be changed to a refractive metal. This again reduces resistivity of the material for the resistor element and causes a larger occupied area for the resistor element.

In short, in the conventional DRAM, it is difficult to reduce the occupied area for the resistor element disposed in the peripheral area of the DRAM, without an increase in the fabrication cost therefor.

SUMMARY OF THE INVENTION

In view of the above, it is an object of the present invention to provide a semiconductor memory device having a reduced occupied area for the resistor element without increasing the fabrication cost for the DRAM.

The present invention provides a semiconductor memory device comprising a semiconductor substrate, a memory cell transistor having a pair of diffused regions on the semiconductor substrate and a gate electrode formed on the semiconductor substrate with an intervention of a gate dielectric film, a dummy pattern formed from a common layer with the gate electrode, an interconnect layer including a contact plug in direct contact with one of the diffused regions, and a resistor section having a resistor element overlying the dummy pattern and formed from a common layer with the interconnect layer.

In accordance with the semiconductor memory device of the present invention, the dummy pattern provides an equal level of the resistor element and the interconnect layer for an exposure step in a photolithographic etching of the resistor element and the interconnect layer. The equal level for the exposure step enables a finer pattern for the resistor element, which affords a reduced occupied area for the resistor element, substantially without increasing the fabrication cost for the semiconductor memory device.

The above and other objects, features and advantages of the present invention will be more apparent from the following description, referring to the accompanying drawings.

PREFERRED EMBODIMENTS OF THE INVENTION

Figure 1:
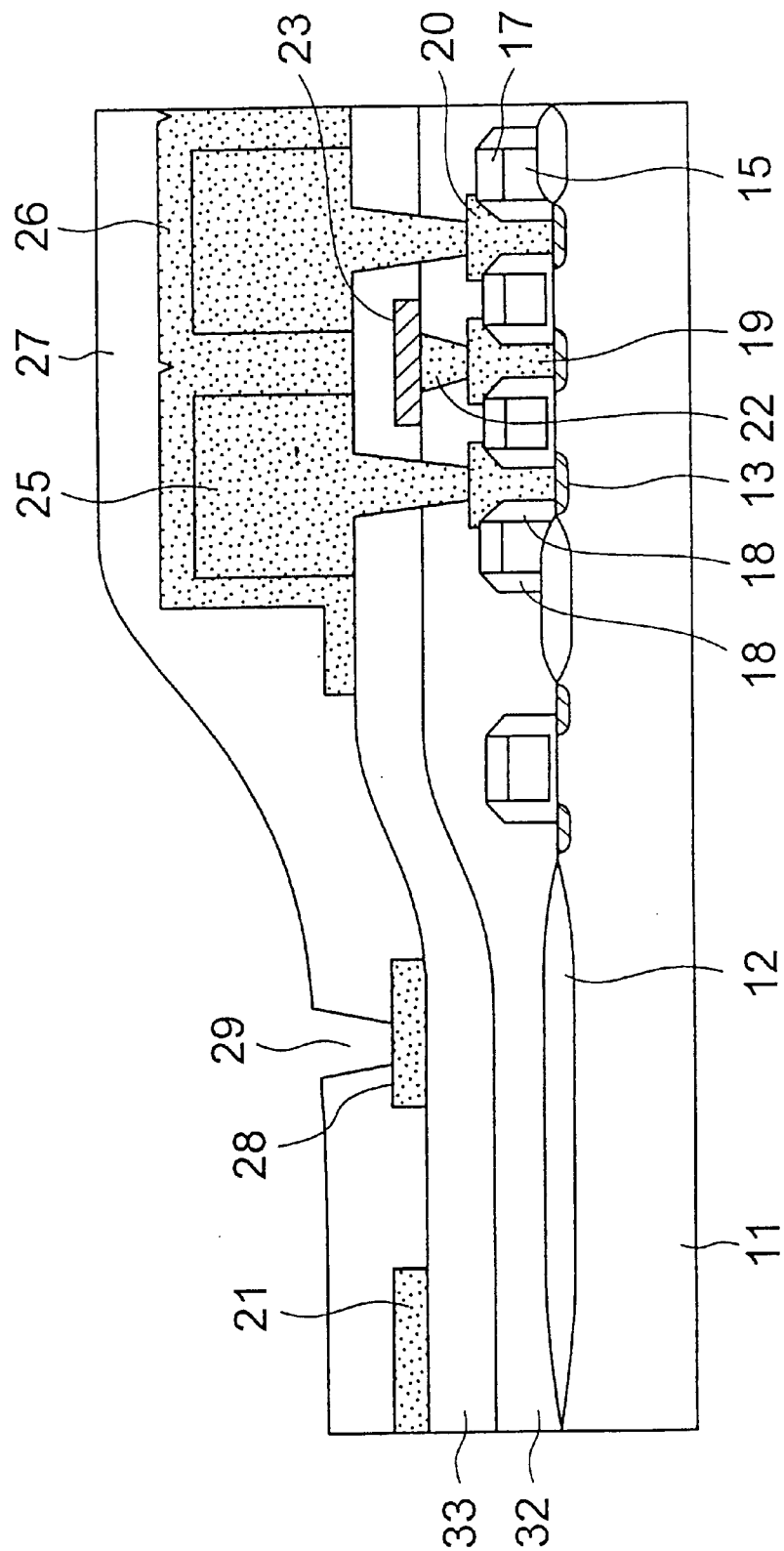
FIG. 1 is a cross-sectional view of a conventional DRAM.
Figure 2A:
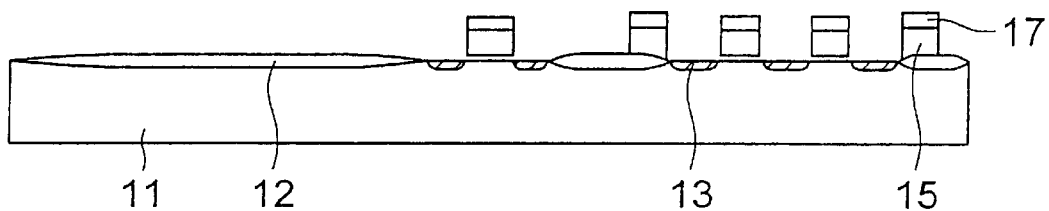
FIGS. 2A to 2E are cross-sectional views of the DRAM of FIG. 1 for showing consecutive steps in a fabrication process therefor.
Figure 2B:
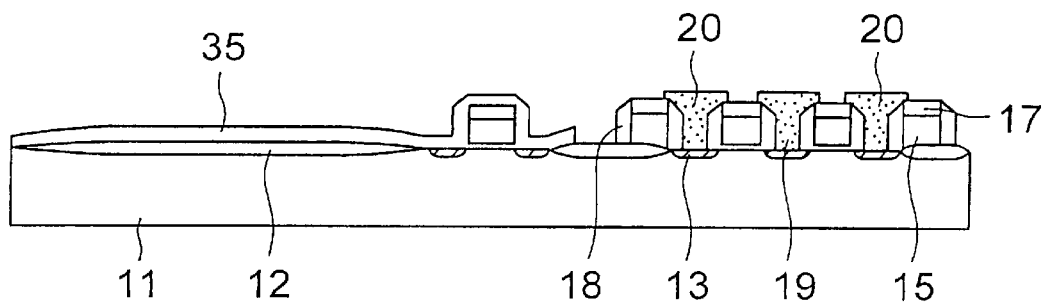
Figure 2C:
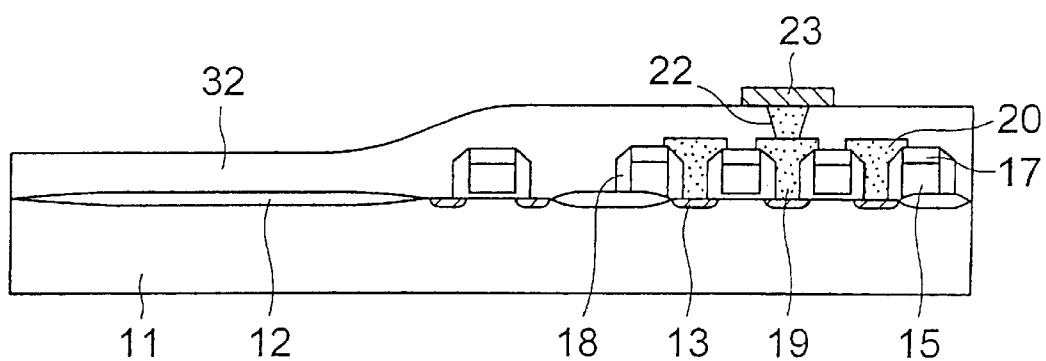
Figure 2D:
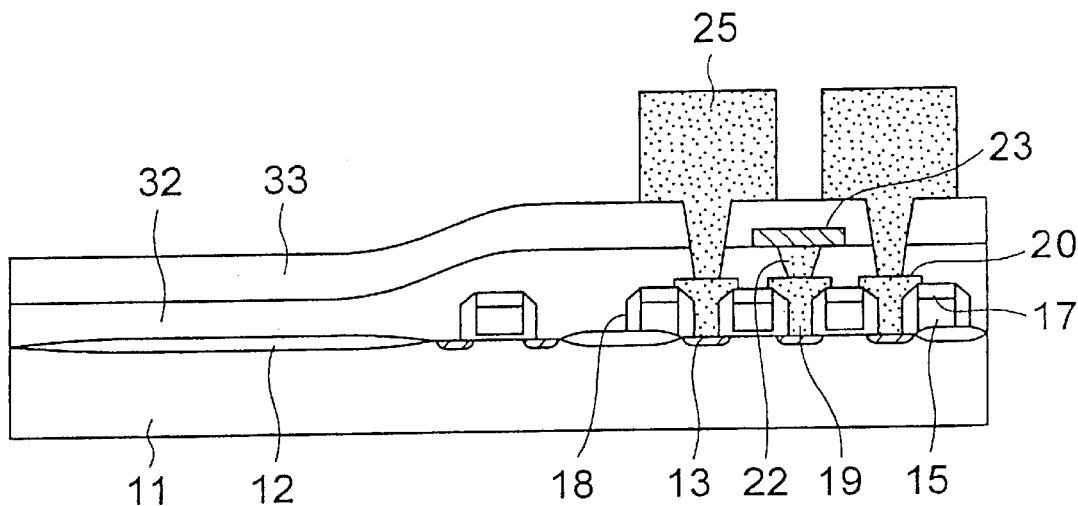
Figure 2E:
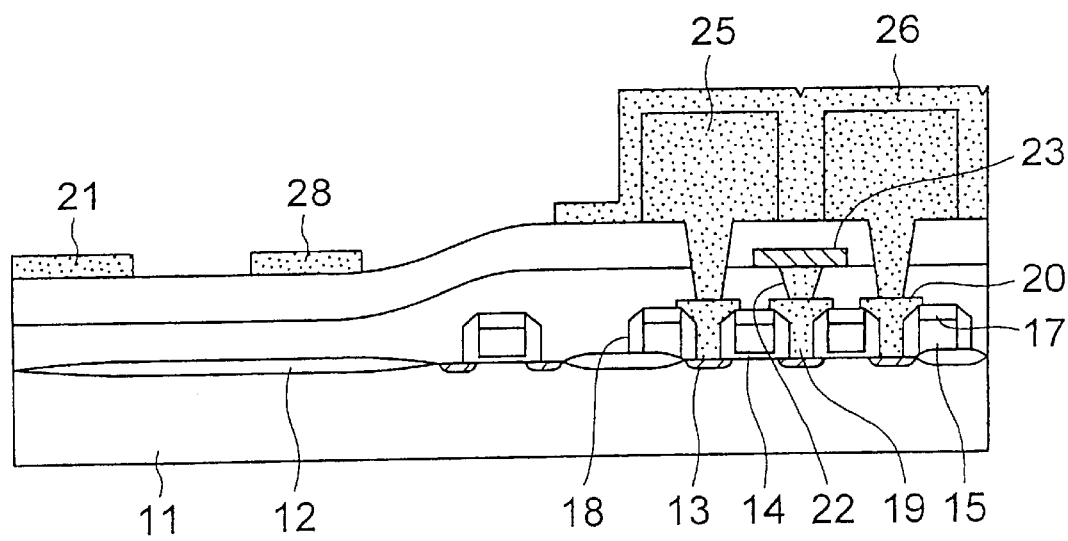
Figure 3:
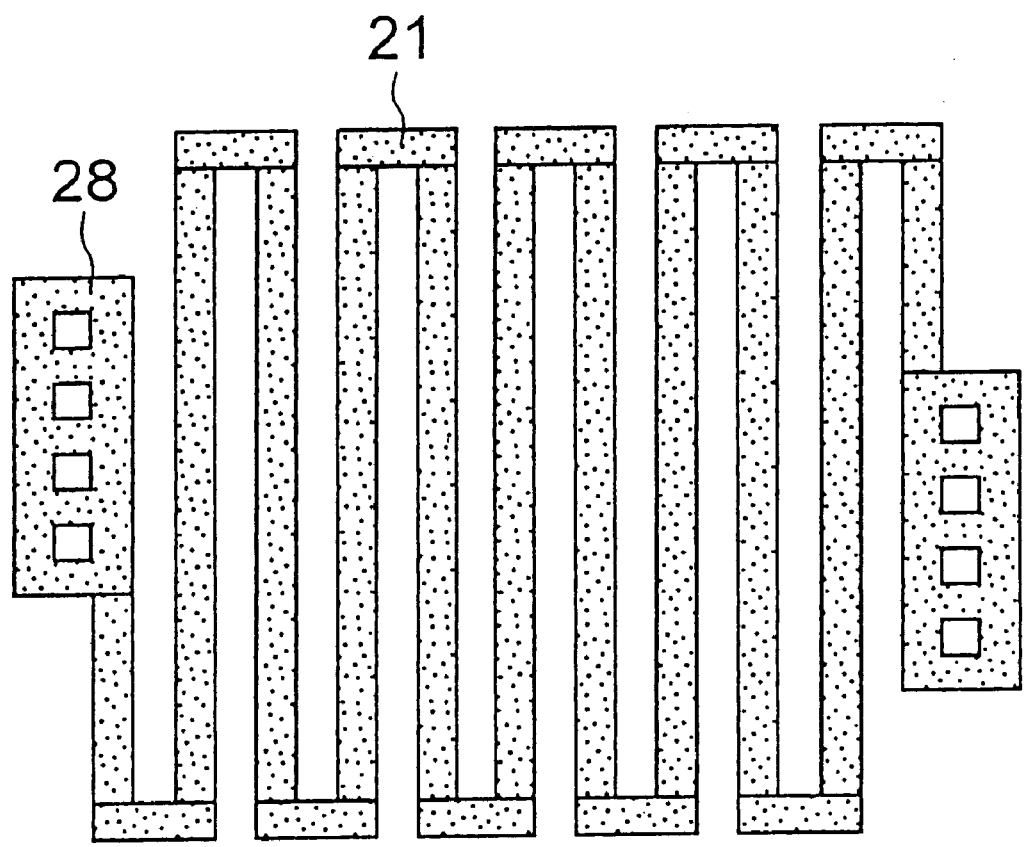
FIG. 3 is a top plan view of the resistor element used in the DRAM of FIG. 1.

Now, the present invention is more specifically described with reference to accompanying drawings, wherein similar constituent elements are designated by similar reference numerals.

Figure 4:
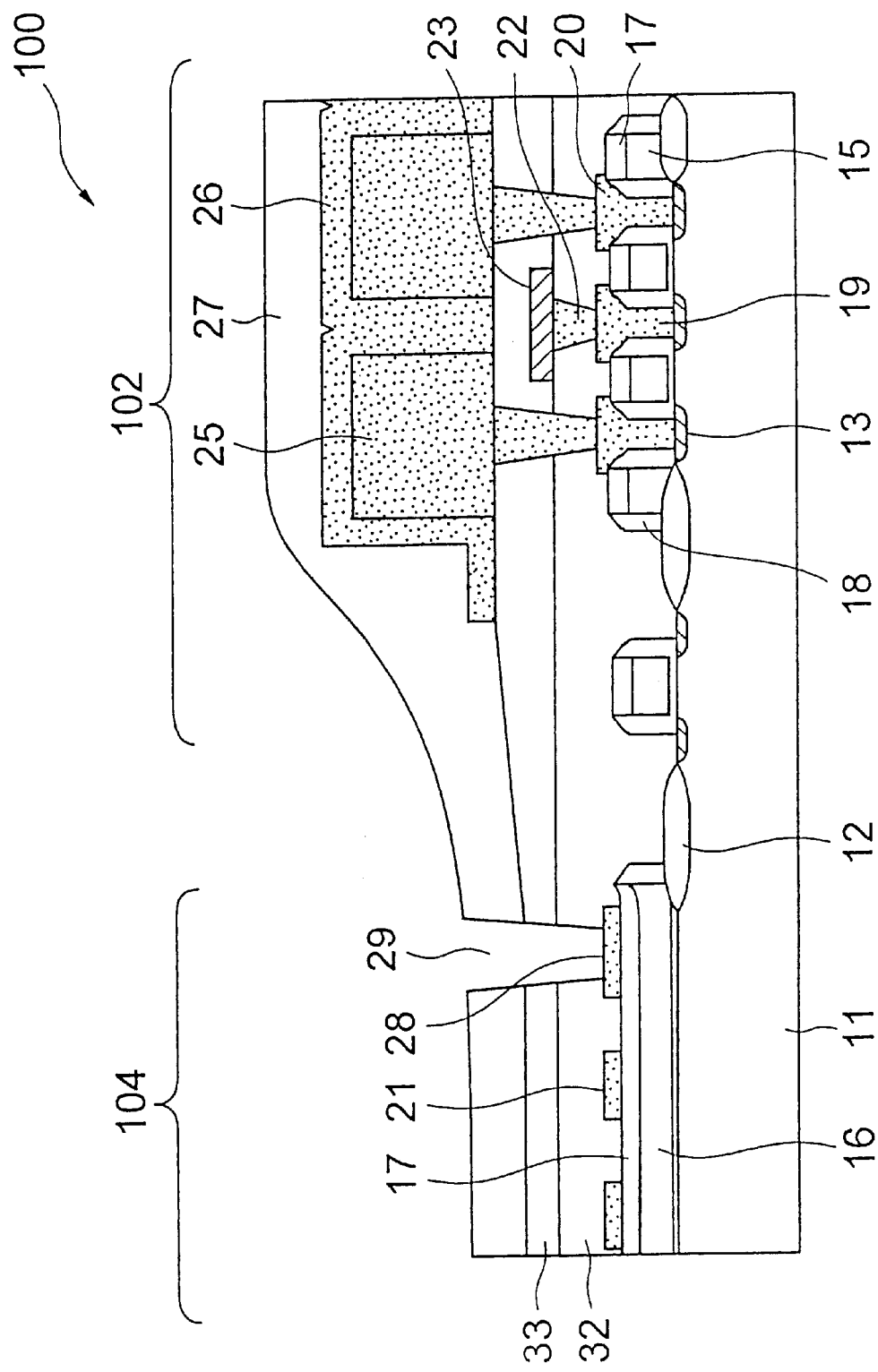
FIG. 4 is a cross-sectional view of a DRAM according to a first embodiment of the present invention.

Referring to FIG. 4, a semiconductor memory device according to a first embodiment of the present invention implements a DRAM 100. The DRAM 100 includes a memory cell area 102 including a plurality of memory cells, and a peripheral area including a plurality of resistor sections 104 each having a resistor element 21 and a pair of lead elements 28 therefor, both areas being formed on a silicon substrate 11.

The memory cell area 102 includes a LOCOS field oxide film 12 formed on the silicon substrate 11, n-type source/drain regions 13 formed in the surface area of the silicon substrate 11 separated by the field oxide film 12, and 200-nm-thick gate electrodes 15 each formed on the silicon substrate 11 with an intervention of a 8-nm-thick gate oxide film not shown.

The gate electrode 15 has a laminate structure including a 100-nm-thick polysilicon film and a 100-nm-thick tungsten silicide film. In the case of a 256 Mbit DRAM, the gate electrodes 15 have a width of 0.22 $\mu$m and arranged at a space of 0.28 $\mu$m therebetween.

The n-type source/drain regions 13 are electrically connected to overlying electrodes via a first contact 19 and a second contact 20. The first and second contacts 19 and 20 are implemented by a phosphorous-doped polysilicon film, and electrically insulated from the gate electrodes 15 by 100-nm-thick cap oxide films 17 formed on the gate electrodes 15 and side wall films 18 formed on the side walls of the gate electrodes 15. In the case of 256 Mbit DRAM, the first and second contacts 19 and 20 have a width of 0.28 $\mu$m as viewed in a plane perpendicular to the gate electrodes 15, and are arranged at a space of 0.22 $\mu$m therebetween.

The first contact 19 is electrically connected to a bit line 23 via a polysilicon plug 22, whereas the second contact 20 is electrically connected to a 800-nm-thick capacitor electrode 25 made of phosphorous-doped polysilicon.

A 8-nm-thick capacitor dielectric film made of silicon nitride and a 150-nm-thick cell plate electrode 26 made of phosphorous-doped polysilicon are formed on the capacitor electrode 25. A third level interlayer dielectric film 27 is formed over the entire surface of the wafer including the surface of the cell plate electrode 26.

On the other hand, in the peripheral area, the resistor section 104 overlies a dummy pattern 16 formed in common with the gate electrodes 15.

The resistor section 104 includes the resistor element 21 and the pair of lead elements 28 for connecting both the ends of the resistor element 21 to overlying electrodes or interconnects. The resistor element 21 and the lead elements 28 are made from a 150-nm-thick phosphorous-doped polysilicon film, The resistor section 104 is formed on the dummy pattern 16 with an intervention of the cap oxide film 17. The lead element 28 is electrically connected to overlying electrode via via holes penetrating the first, second and third level interconnects 27, 33 and 32. In the present embodiment, the resistor element 21 has a line width of 0.24 μm, and are arranged at a line space of 0.30 μm.

In the present embodiment, for the memory cell area 102 and the resistor section 104 in the peripheral area, the first contact 19, the second contact 20, the resistor element 21 and the lead element 28 are formed in a common photolithographic step.

As described above, the resistor element 21 overlies the dummy pattern 16 formed by the process for forming the gate electrodes 15 in the present embodiment, in order to obtain an equal exposure level for both the resistor element 21 and the first and second contacts 19 and 20. This achieves an equal condition for the exposure for the gate electrodes 15 in the memory cell area 102 and the resistor section 104 in the peripheral area. In this configuration, the disadvantage of the inaccurate patterning of the resistor element 21 caused by the step difference, which is as high as 0.4 μm between the level for the first and second contacts 19 and 20 and the level for the resistor element 21 in the conventional DRAM, is avoided. Generally, it is difficult to obtain an accurate patterning for the resistor element 21 having such a low width under the condition of a 0.4 μm step difference if an optimum condition for the exposure is set for the first and second contacts 19 and 20. In the present embodiment, the dummy pattern 16 underlying the resistor section 104 provides the substantially equal level for the exposure.

In the present embodiment, the resistor element 21 has a resistance of 1000 kΩ which is achieved by a length of 4 mm for the width of 0.24 μm of the resistor element 21. This length is significantly small as compared to 16 mm for the length of the resistor element in the conventional DRAM.

Figure 5A:
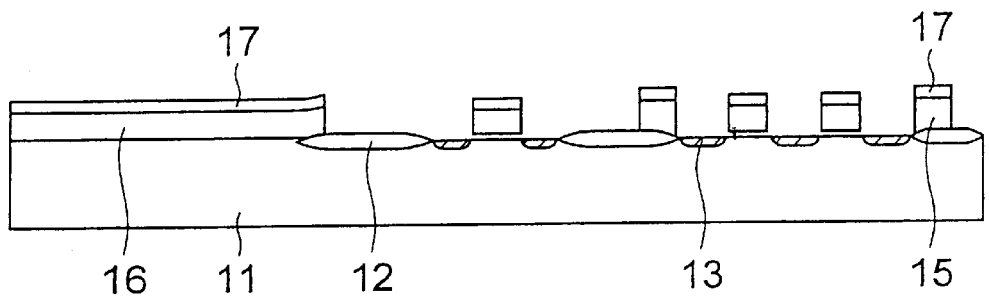
FIGS. 5A to 5E are cross-sectional views of the DRAM of FIG. 4 for showing consecutive steps in a fabrication process therefor.

Next, a fabrication process for the first embodiment will be described with reference to FIGS. 5A to 5E. In FIG. 5A, a 8-nm-thick gate oxide film not shown is formed on a silicon substrate 11 on which a filed oxide film 12 is formed, followed by formation of a plurality of patterned gate structures each including a gate electrode 15 and a cap oxide film 17 and subsequent formation of corresponding source/drain regions 13. The gate structure includes 100-nm-thick oxide film/100-nm-thick polysilicon film/100-nm-thick tungsten silicide film/100-nm-thick polysilicon film, for example, as viewed from the top.

In the peripheral area, the dummy pattern 16 and the cap oxide layer 17 are also formed in a common step with the gate structure in the memory cell area.

Figure 5B:
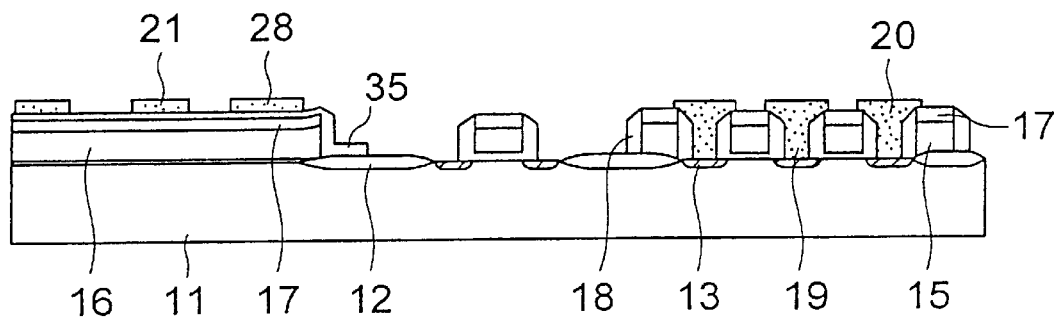

Next, as shown in FIG. 5B, a 60-nm-thick oxide film 35 is grown on the entire surface and etched back in the memory cell area 102, followed by deposition of a 150-nm-thick phosphorous-doped polysilicon film and subsequent patterning thereof to form the first and second contacts 19 and 20. In the peripheral area, the resistor element 21 and the lead elements 28 are formed in the common step with the first and second contacts 19 and 20.

Figure 5C:
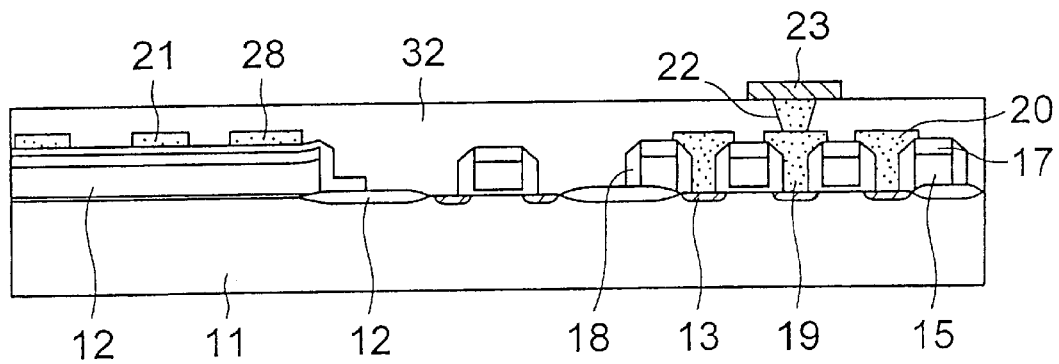

Subsequently, as shown in FIG. 5C, a fits level interlayer dielectric film 32 is formed over the entire surface, followed by patterning thereof to form via holes for the contact plugs on the contacts 19 and subsequently forming polysilicon plug 22 and bit lines 23.

Figure 5D:
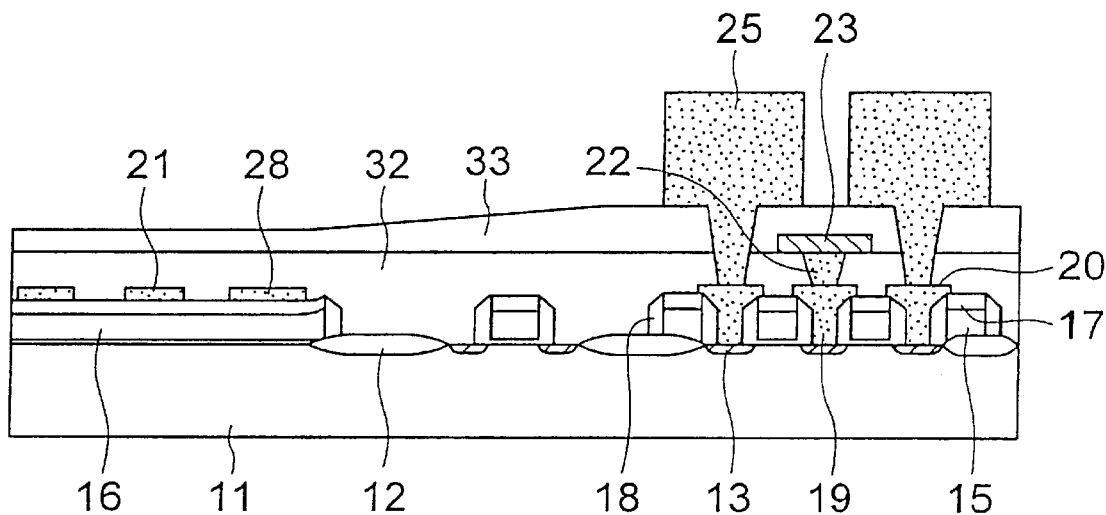

Next, as shown in FIG. 5D, a second level interlayer dielectric film is deposited and patterned by a photolithographic step to form via holes for the capacitor electrode on the second contact 20. Subsequently, a 800-nm-thick phosphorous-doped polysilicon film is grown and patterned to form capacitor electrodes 15.

Figure 5E:
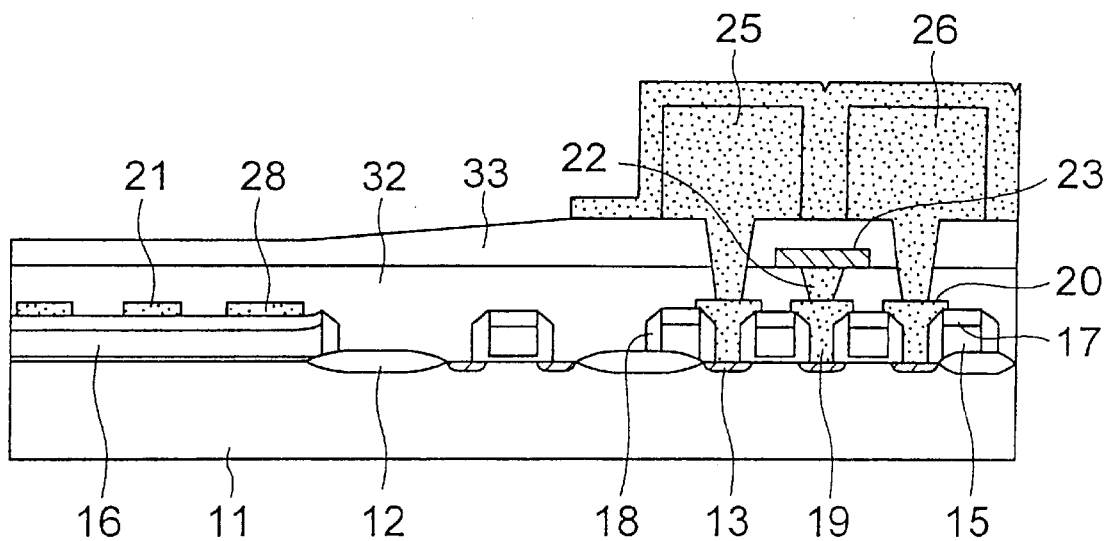

Thereafter, as shown in FIG. 5E, a 8-nm-thick silicon nitride film for capacitor insulation and a 150-nm-thick phosphorous-doped polysilicon film are consecutively grown and patterned by a photolithographic etching to form cell plate electrodes 26 in the memory cell area.

Further, a third level interlayer dielectric film 27 is formed over the entire surface and patterned to form via holes penetrating the third, second and first i15 level interlayer dielectric films 27, 33, 32 to obtain the DRAM 100 of FIG. 4.

In the above embodiment, the field oxide film 12 is formed by a LOCOS technique for isolation of cell regions. However, in the present invention, the isolation may be performed by a trench isolation technique, which provides similar situation for the step difference between the contacts and the resistor elements.

Figure 6:
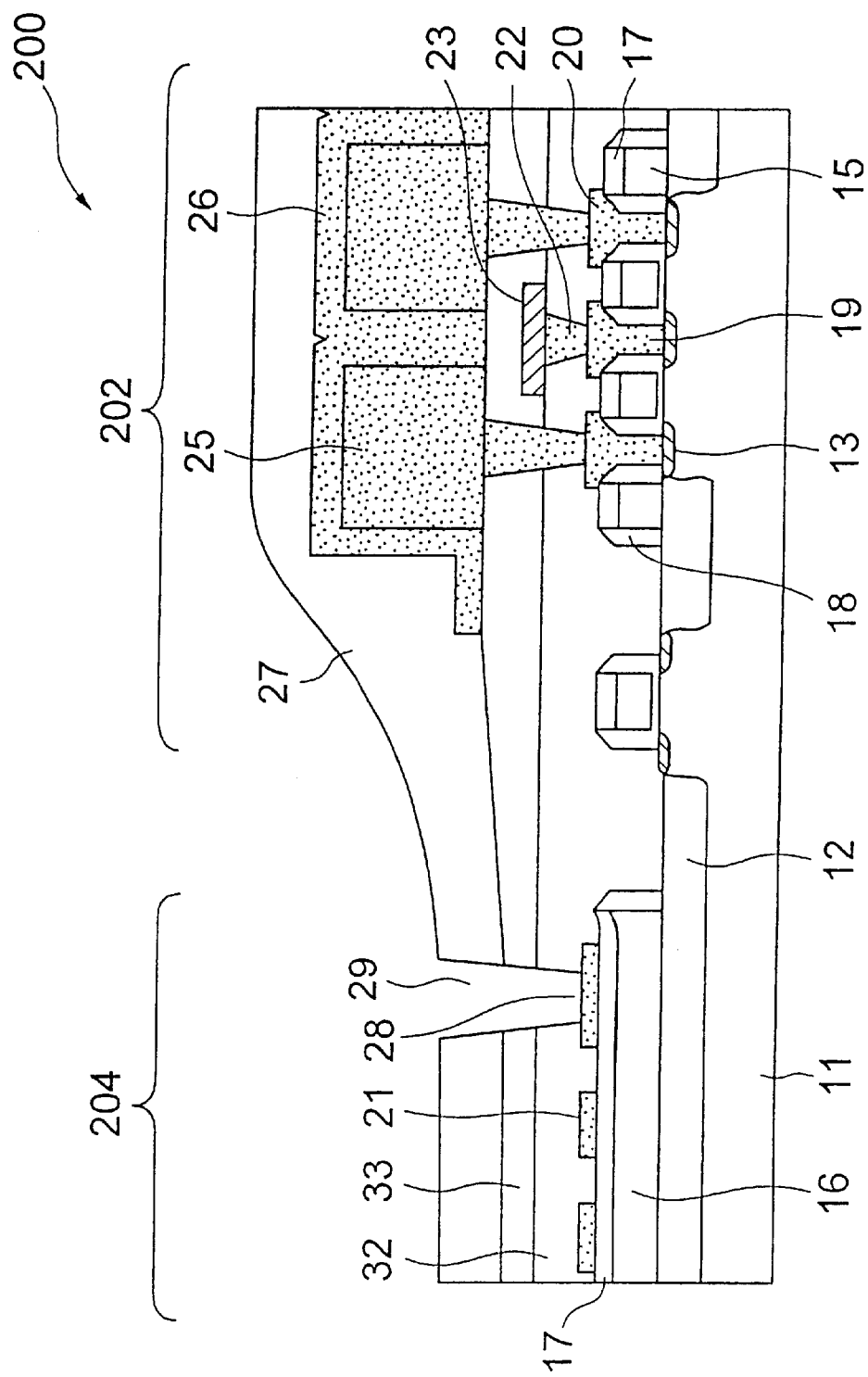
FIG. 6 is a cross-sectional view of a DRAM according to a second embodiment of the present invention.

Referring to FIG. 6, a DRAM 200 according to a second embodiment of the present invention is similar to the first embodiment except that the field oxide film 12 is formed by a trench isolation technique. Specifically, the DRAM 200 includes a memory cell area 202 similar to the memory cell area 102 in the first embodiment, and a resistor section 204 in the peripheral area, wherein the dummy pattern 16 is formed during the step for forming the gate electrodes. The dummy pattern 16 is formed on the field oxide film 12 which is formed at a level 20 nm lower than the surface of the silicon substrate 11 by the trench isolation technique. A 100-nm-thick cap oxide film 17 is also formed on the laminate structure 16. The resistor element 21 and the lead elements 28 are formed on the dummy pattern 16 to a thickness of 150 nm with an intervention of the cap oxide film 17.

In the memory cell area 202 and the resistor section 204 in the peripheral area of the present embodiment, the contacts 19 and 20, the resistor element 21 and the lead elements 28 are formed in the common process. The resistor element 21 has a line width of 0.24 μm, and the space between the lines is 0.30 μ. Thus, the pitch of the lines is 0.24+0.30 μm. In this configuration, the pitch of the lines in the resistor element 21 is selected at a value slightly larger than the pitch of the first and second contacts 19 and 20. However, the pitch of the resistor element 21 may be equal to the pitch of the first and second contacts 19 and 20.

Figure 7A:
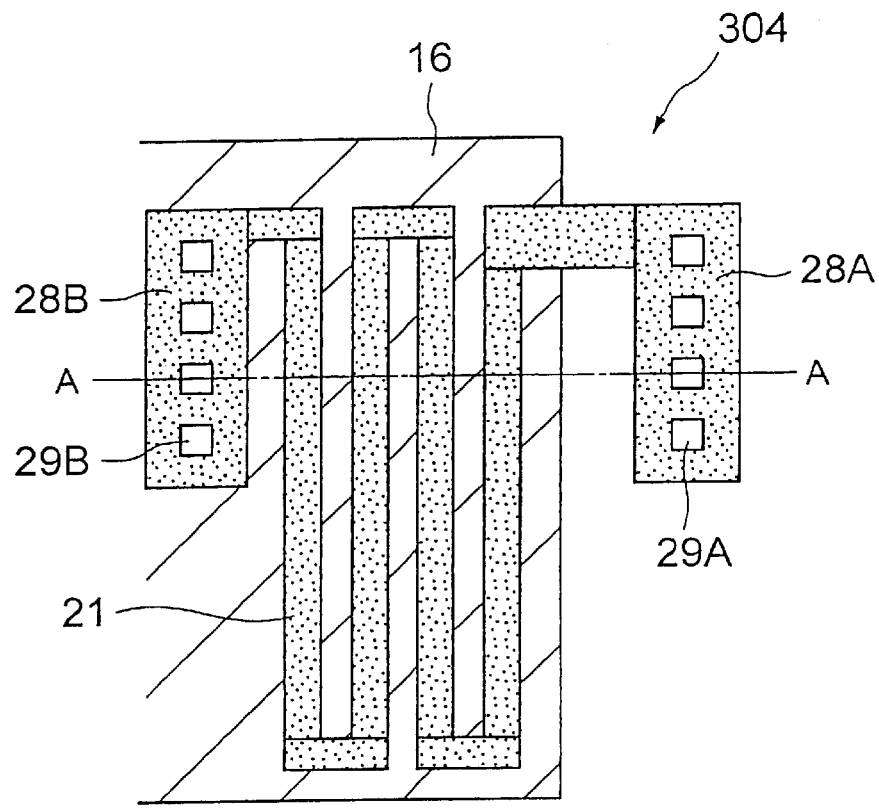
FIG. 7A is a top plan view of a resistor element in a DRAM according to a third embodiment of the present invention.
Figure 7B:
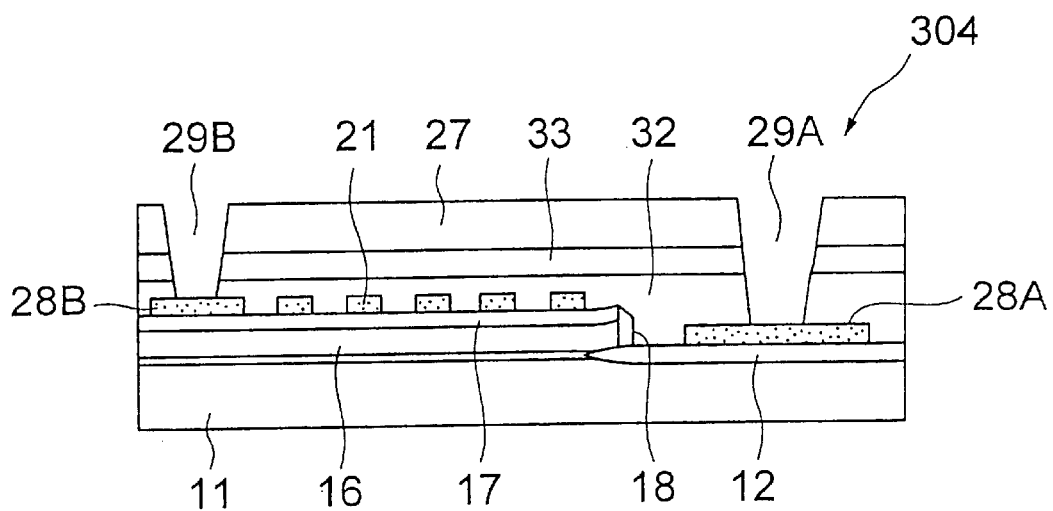
FIG. 7B is a cross-sectional view taken along line A—A in FIG. 7A.

Referring to FIGS. 7A and 7B, a resistor element in a DRAM according to a third embodiment of the present invention has a larger length than the resistor elements in the first and second embodiments. The resistor section 304 has the resistor element 21 and a pair of lead elements 28A and 28B each connected to an overlying electrode via contact plugs 29A or 29B. The lead element 28A is disposed on the field oxide film 12, whereas the lead element 28B as well as the resistor element 21 overlies the dummy pattern 16 formed in the step for forming the gate structure. The resistor element 21 has a line width of 0.24 μm, and a space of 0.30 μm between lines.

In the first embodiment, if the contacts for the lead elements 28 formed in the via holes 29 penetrate the lead elements 28 and the underlying cap oxide film 17 to reach the dummy pattern 16, there may be a short-circuit failure between the contacts. The present embodiment prevents the possible short-circuit failure. Specifically, the level difference between the lead elements 28A and 28B prevents a short-circuit failure across the resistor element 21 even if the contact 29B penetrates the underlying dielectric film 17 to be in contact with the conductive layer of the laminate structure 16. Alternatively, both the lead elements 28A and 28B may be disposed on the field oxide film 12, which also prevents a short-circuit failure.

Figure 8A:
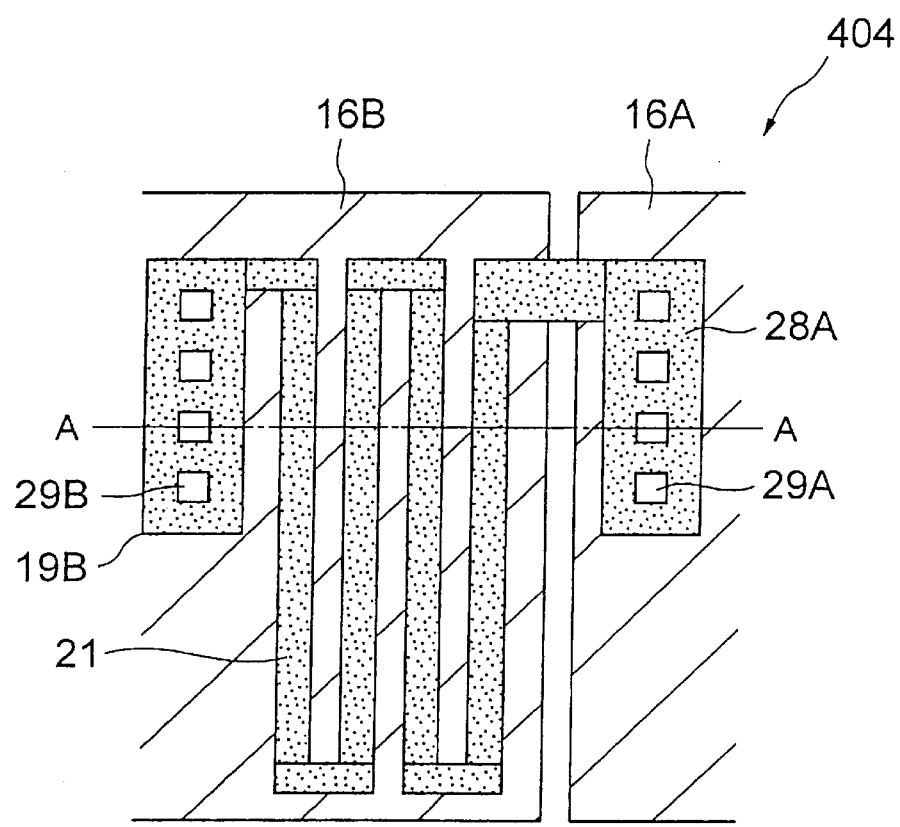
FIG. 8A is a top plan view of a resistor element in a DRAM according to a fourth embodiment of the present invention.
Figure 8B:
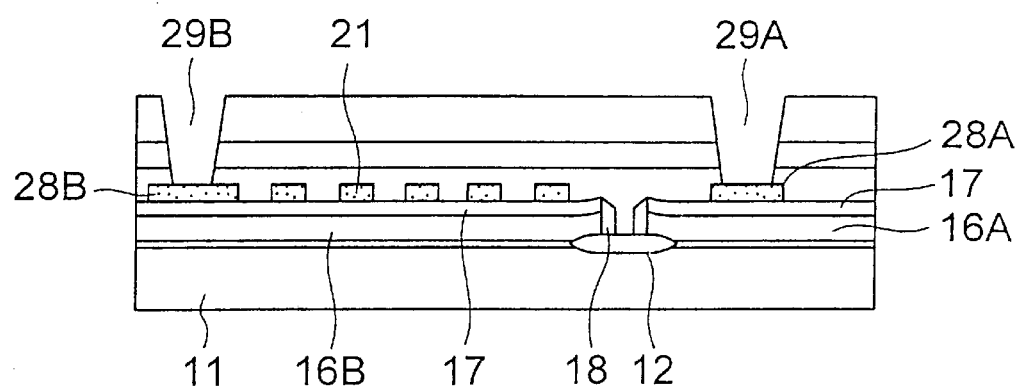
FIG. 8B is a cross-sectional view taken along line A—A in FIG. 8A.

Referring to FIGS. 8A and 8B, a resistor section 404 in a DRAM according to a fourth embodiment is similar to the resistor section 304 in the third embodiment except that the lead element 28A in the fourth embodiment is disposed on another dummy pattern 16 electrically insulated from the dummy pattern on which the corresponding resistor element 21 is disposed. In this configuration, even if contacts 29A and 29B for the lead element 28A and 28B penetrates the cap oxide film 17, a short-circuit failure does not result, as in the case of the third embodiment.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising a semiconductor substrate, a memory cell transistor having a pair of diffused regions on said semiconductor substrate and a gate electrode formed on said semiconductor substrate with an intervention of a gate dielectric film, a dummy pattern formed from a common layer with said gate electrode, an interconnect layer including a contact plug in direct contact with one of said diffused regions, and a resistor section having a resistor element overlying said dummy pattern and formed from a common layer with said interconnect layer.

2. The semiconductor memory device as defined in claim 1, wherein said memory device is a DRAM and said gate electrode constitutes a word line.

3. The semiconductor memory device as defined in claim 2, said dummy pattern is formed on said semiconductor substrate with an intervention of said gate dielectric film.

4. The semiconductor memory device as defined in claim 1, wherein said dummy pattern is formed on a field oxide film, and said field oxide film has a top surface located at a level substantially equal to or below a top surface of said semiconductor substrate.

5. The semiconductor memory device as defined in claim 1, wherein said resistor section further has a pair of lead sections formed from a common layer with said resistor element and connected to a conductive layer, and at least one of said lead sections is disposed at a level below said resistor element.

6. The semiconductor memory device as defined in claim 1, wherein said resistor section further has a pair of lead sections formed from a common layer with said resistor element and connected to a conductive layer, one of said lead sections is disposed on said dummy pattern and the other of said lead sections is disposed on another dummy pattern formed from a common layer with said gate electrode and insulated from said dummy pattern.

7. The semiconductor memory device as defined in claim 1, wherein said resistor element and said interconnect layer are made of polycrystalline silicon.

\* \* \* \* \*